(12) United States Patent
Mani

(10) Patent No.: US 7,830,704 B1
(45) Date of Patent: Nov. 9, 2010

(54) COMPACT MAGNETIC RANDOM ACCESS MEMORY CELL WITH SLOTTED BIT LINE AND METHOD OF MANUFACTURING SAME

(75) Inventor: Krishnakumar Mani, San Jose, CA (US)

(73) Assignee: Magsil Corporation, Santa Clara, CA (US)

( * ) Notice: Subject to any disclaimer, the term of this patent is extended or adjusted under 35 U.S.C. 154(b) by 157 days.

(21) Appl. No.: 12/134,802

(22) Filed: Jun. 6, 2008

Related U.S. Application Data

(60) Provisional application No. 60/942,205, filed on Jun. 6, 2007.

(51) Int. Cl.
*G11C 11/00* (2006.01)

(52) U.S. Cl. .................................................. 365/158

(58) Field of Classification Search .................. 365/158
See application file for complete search history.

(56) References Cited

U.S. PATENT DOCUMENTS

2003/0146515 A1 * 8/2003 Kajiyama .................... 257/758

* cited by examiner

*Primary Examiner*—Hoai V Ho
(74) *Attorney, Agent, or Firm*—Hahn & Moodley LLP; Vani Moodley, Esq.

(57) ABSTRACT

Embodiments of the invention provide compact magnetic random access memory cell, comprising a word line; a bit line comprising a slot formed therein; a magnetic storage element disposed between the word line and the bit line; an access transistor located below the bit line and aligned with the slot therein; and a conductor passing through the slot in the bit line electrically connect the magnetic storage element to the access transistor.

8 Claims, 9 Drawing Sheets

2

COMPACT MAGNETIC RANDOM ACCESS MEMORY CELL WITH SLOTTED BIT LINE AND METHOD OF MANUFACTURING SAME

This application claims the benefit of priority to U.S. Provisional Patent Application 60/942,205 filed, Jun. 6, 2007, the specification of which is hereby incorporated by reference.

FIELD

Embodiments of the invention relate to a magnetic memory and a method of manufacturing same.

BACKGROUND

With a Magnetic Random Access Memory (MRAM) cell design known to the inventor, a bottom electrode (BE) is used to connect a magnetic element e.g. in the form of a Magnetic Tunnel Junction (MTJ) to a laterally offset access transistor. The bottom electrode extends a certain horizontal distance away from the magnetic element before connecting with the access transistor. This leads to an increased memory cell size. This limits the memory density and the scaling of MRAM devices.

SUMMARY OF THE INVENTION

According to one aspect of the invention, there is provided a compact magnetic memory cell comprising a magnetic element disposed between a word line and a bit line having a slot or hole extending there through; and a bottom electrode connecting the magnetic element to an access transistor disposed below the bit line through the via.

Other aspects of the invention will be apparent from the detailed description below:

BRIEF DESCRIPTION OF THE DRAWINGS

FIG. 2 shows a schematic drawing of a memory array comprising four compact MRAM cells arranged in a 2×2 array, in accordance with one embodiment of the invention.

DETAILED DESCRIPTION

In the following description; for purposes of explanation, numerous specific details are set forth in order to provide a thorough understanding of the invention. It will be apparent, however, to one skilled in the art that the invention can be practiced without these specific details.

Reference in this specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

Figure 1:
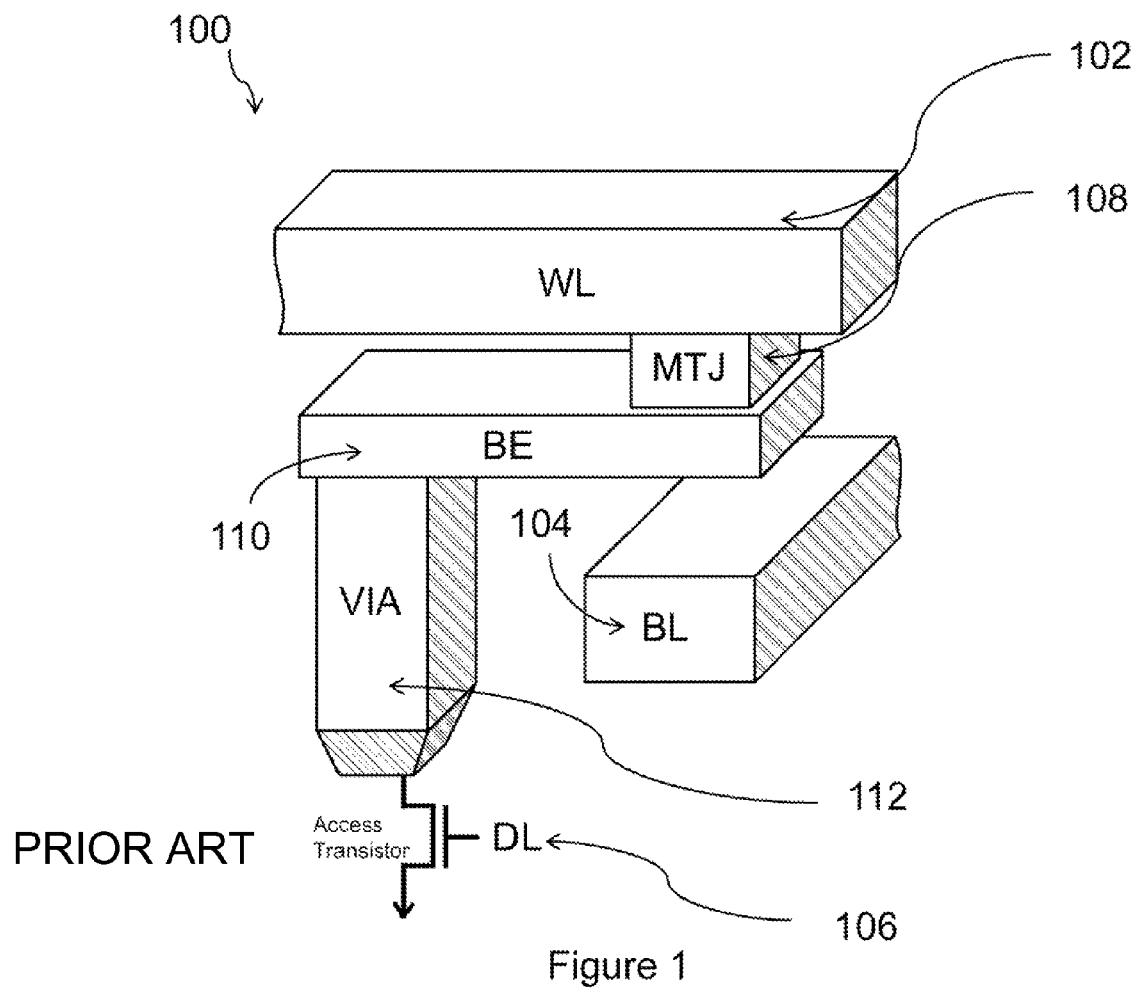
FIG. 1 shows a schematic drawing of an MRAM cell known to the inventor.

FIG. 1 of the drawings shows a schematic drawing of a Magnetic Random Access (MRAM) cell 100, known to the inventor. As will be seen the MRAM cell 100 comprises a word line (WL) 102, a bit line (BL) 104, a digit line (DL) 106, a magnetic element 108, e.g. in the form of a Magnetic Tunnel Junction (MTJ) or similar device, and an access transistor. A top of the magnetic element 108 is connected to the WL 102. A bottom of the magnetic element 104 is connected to a bottom electrode (BE) 110 which in turn is coupled to the access transistor through metallization in a via 112. As will be seen, the access transistor is laterally offset relative to the magnetic element 108, requiring the bit line 110 to extend a certain horizontal distance before it connects to the metallization in the via 112. This results in an increase in a cell size for the cell 100 and associated problems mention in the background section.

Embodiments of the present invention provide an compact MRAM cell with a via or hole extending through a bit line and a conductor passing through the via to connect a magnetic element to an access transistor. Embodiments of the invention also cover a very high density memory device comprising a plurality of the compact MRAM cells. Embodiments of the present invention also provide a method for manufacturing the very high density MRAM device.

Advantageously, mobile devices, such as mobile phones, Personal Digital Assistants (PDA's), digital cameras, etc. that use the magnetic memory device will have very low cost of manufacturing.

Figure 2:
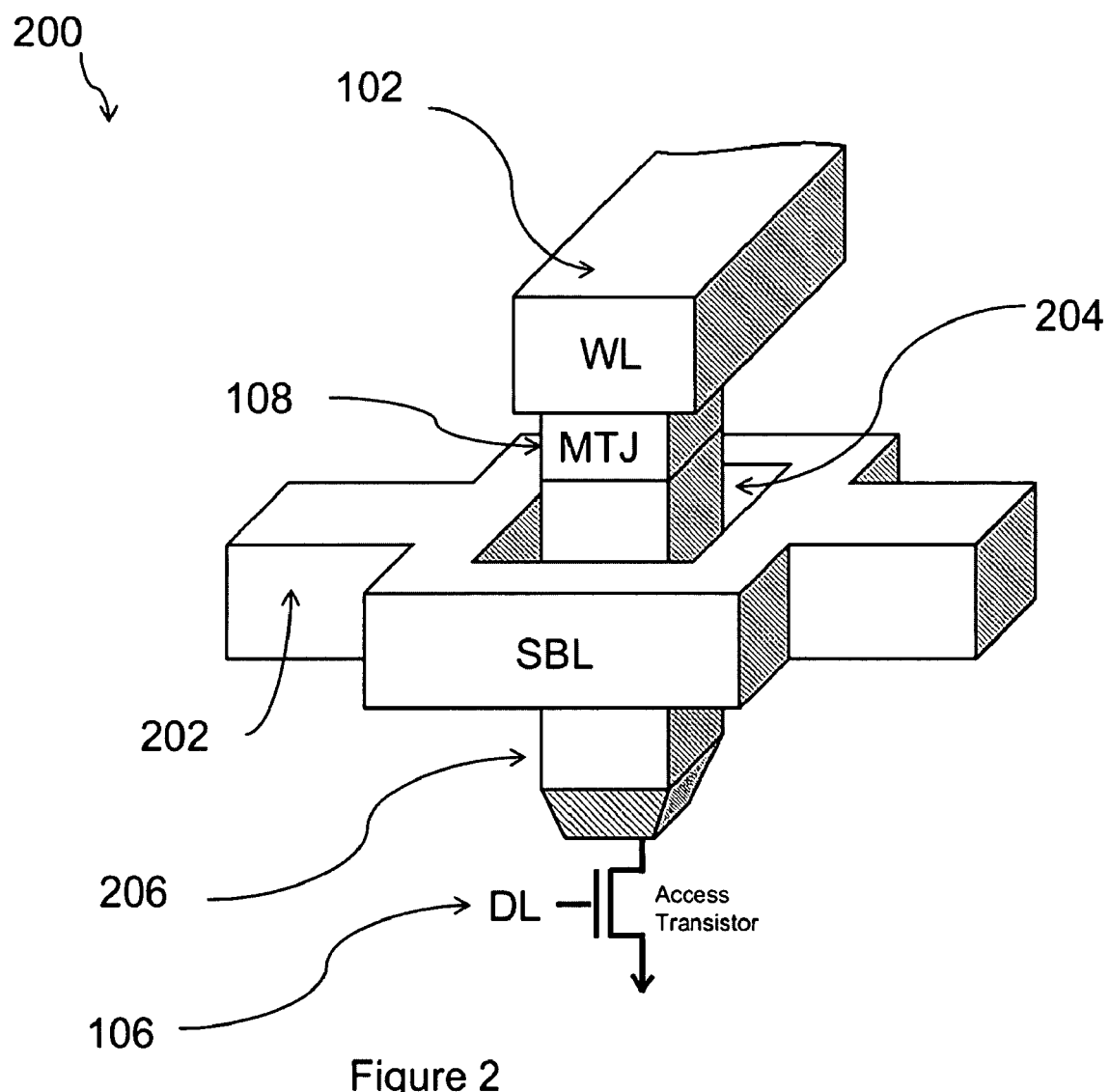
FIG. 2 shows a schematic drawing of a compact MRAM cell with a slotted bit line, in accordance with one embodiment of the invention.

FIG. 2 shows a schematic drawing of a an embodiment 200 of the compact MRAM cell, in accordance with one embodiment of the invention. In FIG. 2, the same reference numerals as in FIG. 1 have been used to indicate components in common with the MRAM cell 100.

Referring to FIG. 2, it will be seen that the embodiment 200 comprises a slotted bit line (SBL) 202 which includes a slot or hole 204 extending there through. Moreover, the laterally extending bottom electrode 110 has been replaced with a conductor 206 that extends downwardly from the magnetic element 108 and passes through the hole 204 in the slotted bit line 202 to connect with and access transistor.

Figure 3:
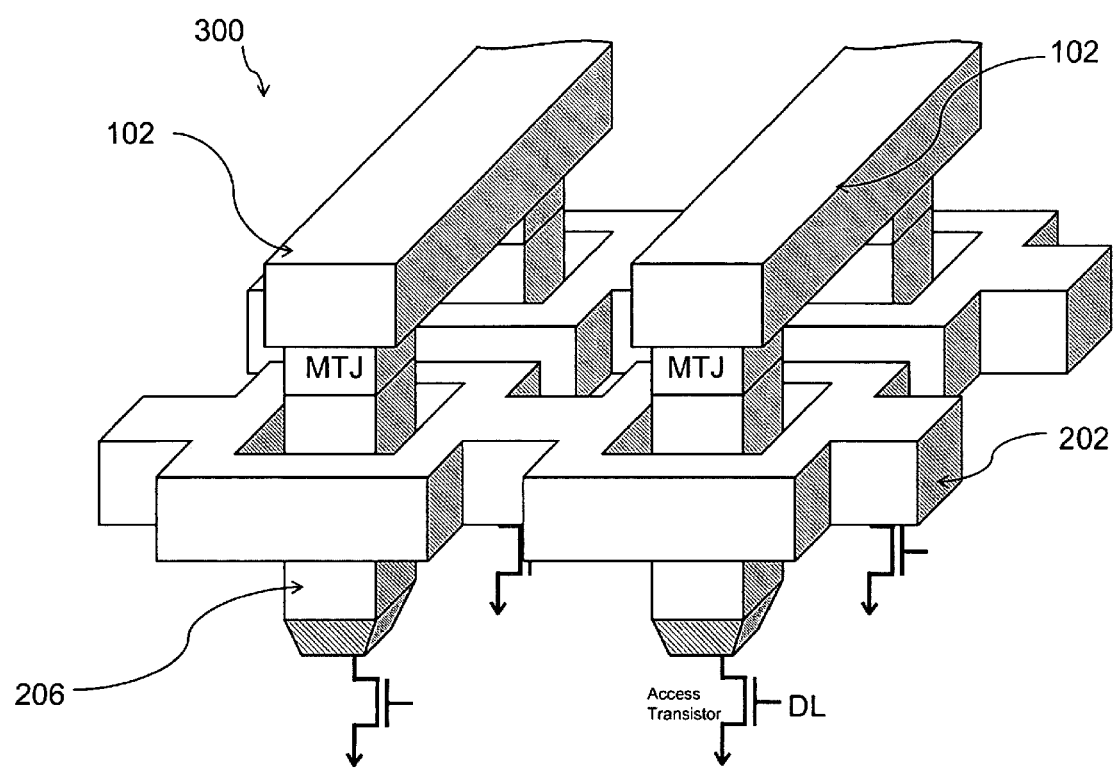

The MRAM cell 200 is more compact than the MRAM cell 100 since the laterally extending bottom electrode has been omitted. Accordingly and advantageously higher density MRAM memory arrays may be fabricated using the MRAM cell 200. By way of example, FIG. 3 of the drawings shows a schematic drawing of a memory array 300 comprising four memory cells 200 arranged in a 2×2 configuration. Many of the components of the memory array 300 have been omitted so as not to obscure the present invention. However, these components will be apparent to one of skilled in the art.

The spatial extent of the array 300 is reduced when compared to a similar array comprising MRAM cells 100 instead. The extent of this spatial reduction may be calculated as follows utilizing a normalized unit of measurement called "F".

Definition of F

Semiconductor circuits are made of dielectric, metal and conductive features which in general are rectangular in shape.

Figure 4:
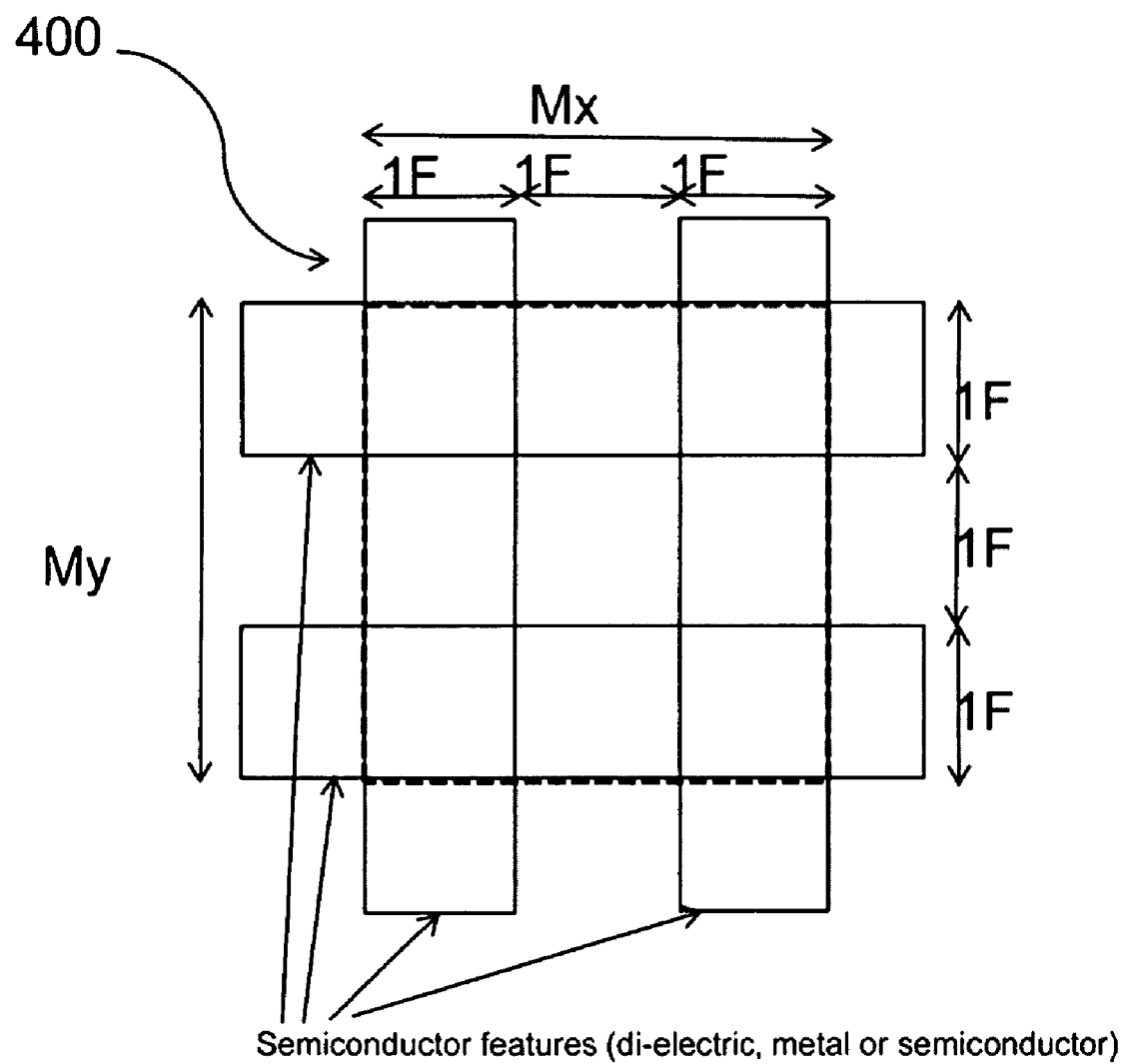
FIG. 4 illustrates the cell size measurement unit "F".

The widths and spaces between these features are measured in a normalized unit called "F". F is the smallest feature that can be manufactured in a given semiconductor process technology. The memory cell sizes are calculated by multiplying the unit memory cell width and length expressed in F. This gives a figure of merit for cell size comparison independent of the process technology used For example, referring to FIG. 4 of the drawings, the area occupied by a memory cell 400 indicated by the dotted square may be calculated as follows. Mx and My are the x and y dimensions of the memory cell. The memory cell area can be expressed as Mx times My or 3 F×3 F=9 $F^2$.

Figures 5A, 5B:
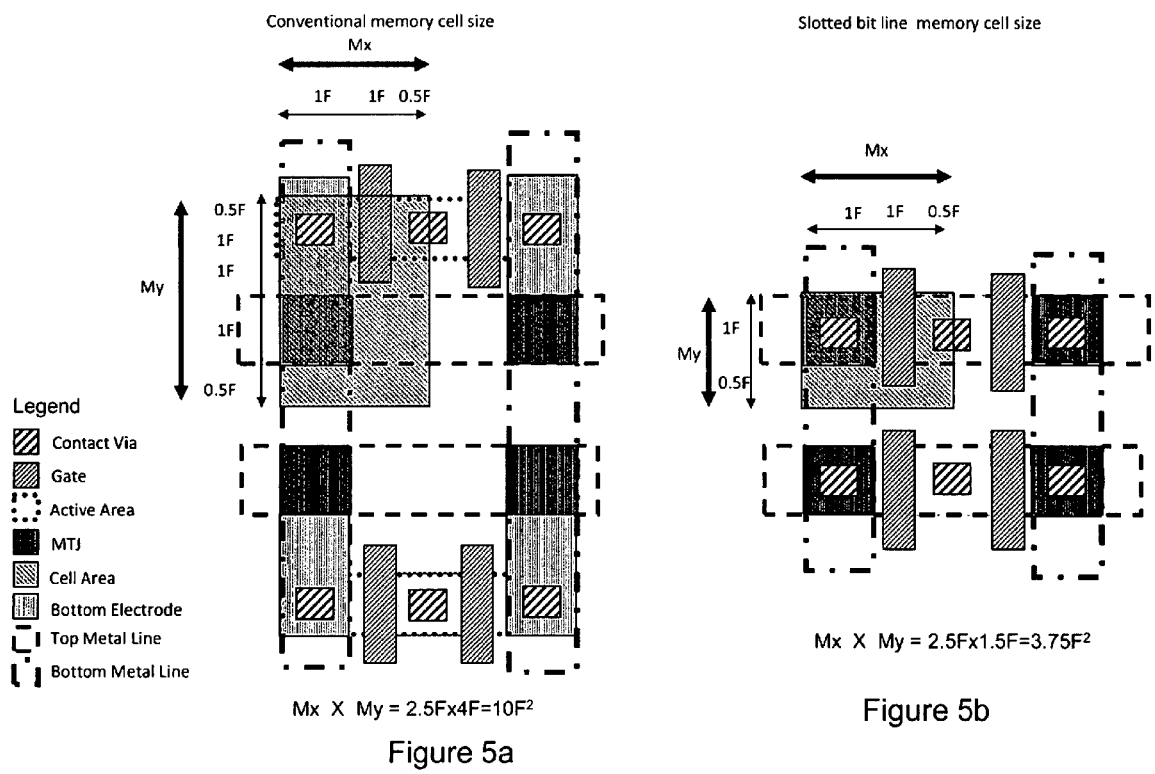
FIG. 5*a* illustrates a cell size calculation for the MRAM cell of FIG. 1.
FIG. 5*b* illustrates a cell size calculation for the compact MRAM cell of the present invention.

Referring to FIGS. 5a and 5b of the drawings it will be seen that the memory cell 100 has an area of 10 $F^2$, whereas the memory cell 200 has an area of only 3.75 F.

Figure 6:
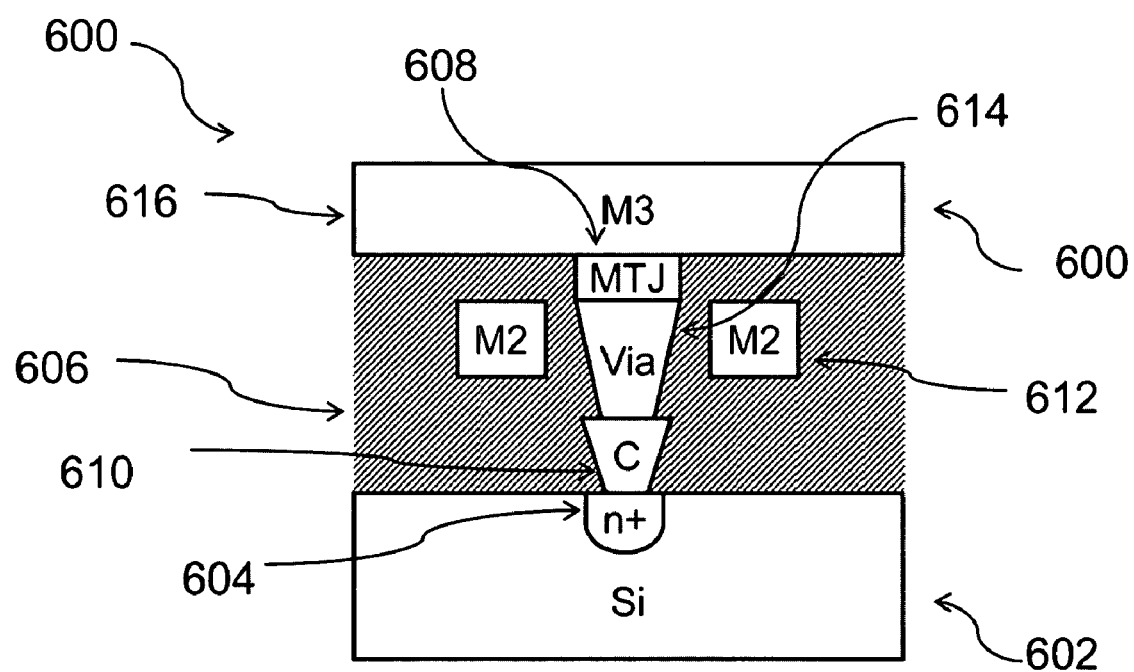
FIG. 6 shows a cross-section through another embodiment of the compact MRAM cell of the present invention.

FIG. 6 of the drawings shows another embodiment 600 of the compact MRAM cell of the present invention. The embodiment 600 is shown in cross-section in order to facilitate discussion of a method for manufacturing the compact MRAM cells of the present invention.

As will be seen, the embodiment 600 comprises a silicon (Si) substrate/wafer 602 which has a heavily doped region 604. Overlying the substrate 602 is a dielectric layer 606. Formed in the dielectric layer 606 is a magnetic element 608 which is connected to a contact 110 filled with metal M1. Metal M2 indicated by reference numeral 612 indicates slotted bit line. Via 614 is formed in the dielectric layer 606 and extends through the hole in the slotted bit line 612. The via 614 is metalized and serves to connect the magnetic element 608 to the contact 610. In one embodiment, the magnetic element may comprise a MTJ. Metal layer 616 (M3) defines a word line for the MRAM cell 600.

Figure 7A:
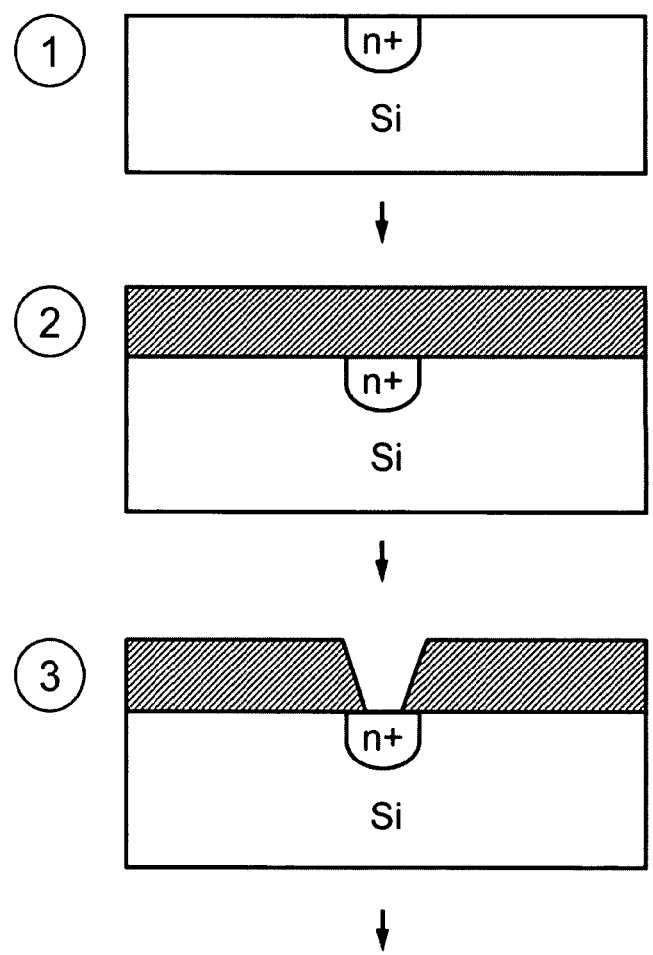
FIGS. 7*a* to 7*c* illustrate one embodiment of a manufacturing process flow for manufacturing the compact MRAM cell of the present invention.
Figure 7B:
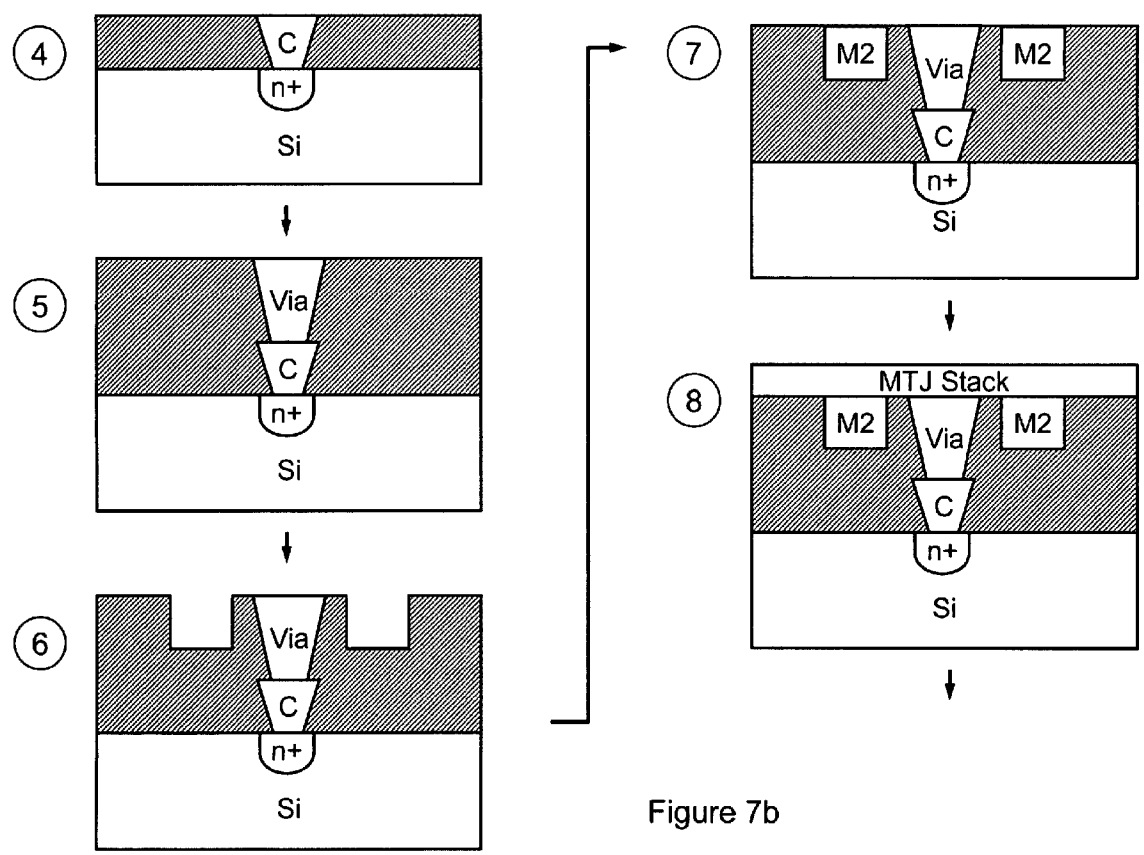
Figure 7C:
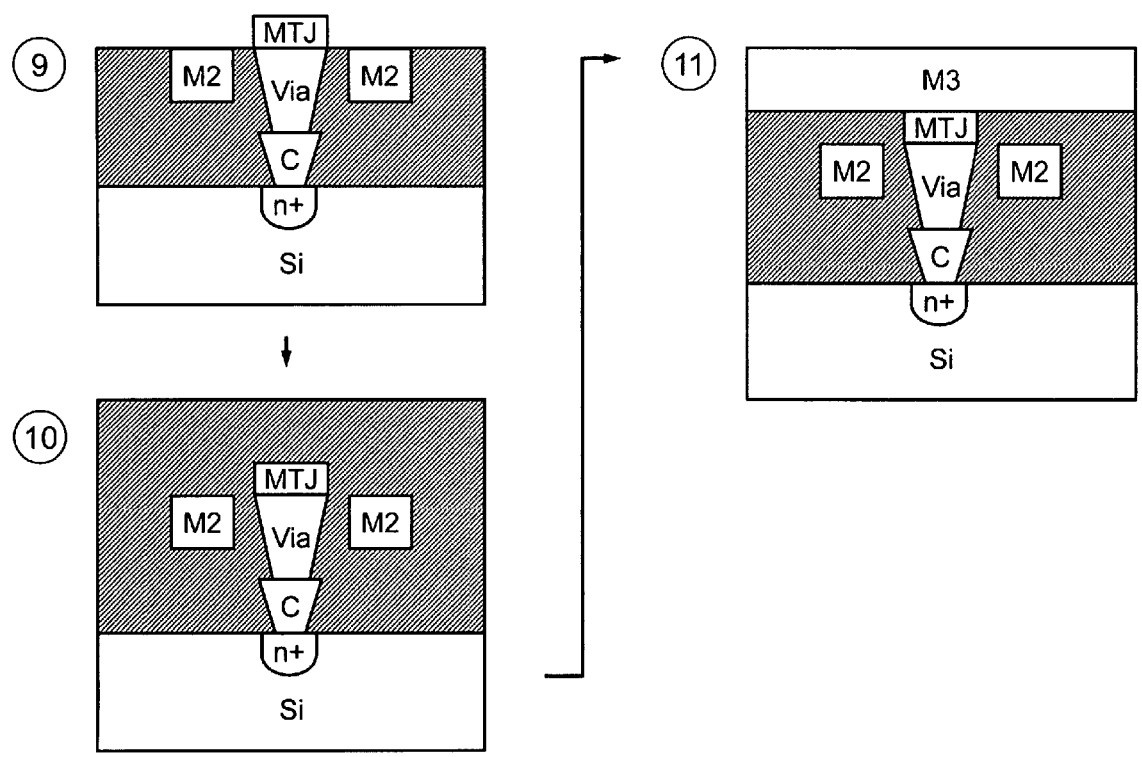

FIGS. 7a to 7c illustrate a process for manufacturing the MRAM cell 600, in accordance with one embodiment. The numbered processing blocks in FIGS. 7a to 7b are outlined below as the details of each of the blocks would be understood by one skilled in the art:

Process Steps
1. CMOS transistor fabrication completed
2. Oxide deposition
3. Contact hole definition
4. Contact hole fill+Chemical Mechanical Planarization (CMP)
5. Oxide deposition+M2 trench definition
6. M2 fill+CMP
7. Oxide deposition+Via definition
8. Bottom Electrode+MTJ Stack deposition
9. MTJ patterning using hard mask
10. Bottom electrode patterning
11. Oxide deposition+CMP
12. M3 Definition (Damascene)

Although the present invention has been described with reference to specific exemplary embodiments, it will be evident that the various modification and changes can be made to these embodiments without departing from the broader spirit of the invention. Accordingly, the specification and drawings are to be regarded in an illustrative sense rather than in a restrictive sense.

The invention claimed is:

1. A magnetic random access memory cell, comprising:
   a word line;
   a bit line comprising a slot formed therein;
   a magnetic storage element disposed between the word line and the bit line;
   an access transistor located below the bit line and aligned with the slot therein; and
   a conductor passing through the slot in the bit line electrically connect the magnetic storage element to the access transistor; wherein an area of the cell is 3.75 F.

2. The magnetic random access memory cell of claim 1, wherein the magnetic storage element comprises a Magnetic Tunnel Junction (MTJ).

3. The magnetic storage random access memory cell of claim 1, wherein the conductor is not laterally offset relative to the magnetic storage element.

4. The magnetic random access memory cell of claim 1, wherein the conductor is defined at least in part by a conductive via formed in a dielectric material.

5. A memory device, comprising:
   an array of magnetic random access memory cells arranged in grid a word line, wherein
   each magnetic random access memory cell comprises:
      a bit line comprising a slot formed therein;
      a magnetic storage element disposed between the word line and the bit line;
      an access transistor located below the bit line and aligned with the slot therein; and
   a conductor passing through the slot in the bit line electrically connect the magnetic storage element to the access transistor; wherein an area of the cell is 3.75 F.

6. The memory device of claim 5, wherein the magnetic storage element comprises a Magnetic Tunnel Junction (MTJ).

7. The memory device of claim 5, wherein the conductor is not laterally offset relative to the magnetic storage element.

8. The memory device of claim 5, wherein the conductor is defined at least in part by a conductive via formed in a dielectric material.

* * * * *